United States Patent
Farjadrad

(10) Patent No.: US 7,669,106 B1
(45) Date of Patent: Feb. 23, 2010

(54) OPTIMIZATION OF LOW DENSITY PARITY CHECK (LDPC) BUILDING BLOCKS USING MULTI-INPUT GILBERT CELLS

(75) Inventor: Ramin Farjadrad, Mt. View, CA (US)

(73) Assignee: Aquantia Corporation, Milpitas, CA (US)

( * ) Notice: Subject to any disclaimer, the term of this patent is extended or adjusted under 35 U.S.C. 154(b) by 640 days.

(21) Appl. No.: 11/405,646

(22) Filed: Apr. 17, 2006

Related U.S. Application Data

(66) Substitute for application No. 60/671,820, filed on Apr. 15, 2005.

(51) Int. Cl.
*H03M 13/00* (2006.01)
(52) U.S. Cl. .................. 714/758; 714/753; 714/768
(58) Field of Classification Search ............ 714/758, 714/753, 755, 764, 768; 708/620; 455/118, 455/326
See application file for complete search history.

(56) References Cited

U.S. PATENT DOCUMENTS

| | | | | |
|---|---|---|---|---|
| 4,950,917 | A * | 8/1990 | Holler et al. | 706/38 |
| 5,519,811 | A * | 5/1996 | Yoneda et al. | 706/33 |
| 6,603,722 | B1 * | 8/2003 | Taguchi et al. | 369/59.21 |
| 7,027,783 | B2 * | 4/2006 | Vilhonen et al. | 455/118 |
| 7,088,981 | B2 * | 8/2006 | Chang | 455/326 |
| 7,418,468 | B2 * | 8/2008 | Winstead et al. | 708/620 |

OTHER PUBLICATIONS

Saied Hemati; Amir H. Banihashemi,Iterative Decoding in Analog CMOS, 2003, ACM New York, NY, USA.*
Ruttik K.,Error Analysis of the CMOS Based Soft Gate for Analog Turbo Decoder,Sep. 5-8, 2004, IEE International Symposium, vol. 2, pp. 1312-1316.*
Loeliger, Hans-Andrea et al., "Decoding in Analog VLSI," IEEE Communications, Apr. 1999, pp. 99-101.
Kschischang, Frank R. et al., "Factor Graphs and the Sum-Product Algorithm," IEEE Transactions on Information Theory, Feb. 2001, 47(2), pp. 498-519.

* cited by examiner

*Primary Examiner*—Scott T Baderman
*Assistant Examiner*—Fritz Alphonse
(74) *Attorney, Agent, or Firm*—Sawyer Law Group, P.C.

(57) ABSTRACT

Described are an iterative decoder and method for implementing an iterative decoder which can be used for error correction in data communications. In one implementation, the method includes implementing a first function including a first plurality of Gilbert cells, and implementing a second function including a second plurality of Gilbert cells, where examples of the first and second functions include an equality constraint function and a parity check function. Each of the first plurality of Gilbert cells and the second plurality of Gilbert cells includes n m-input Gilbert multipliers, in which n is an integer greater than (3) and m=(n−1).

12 Claims, 9 Drawing Sheets

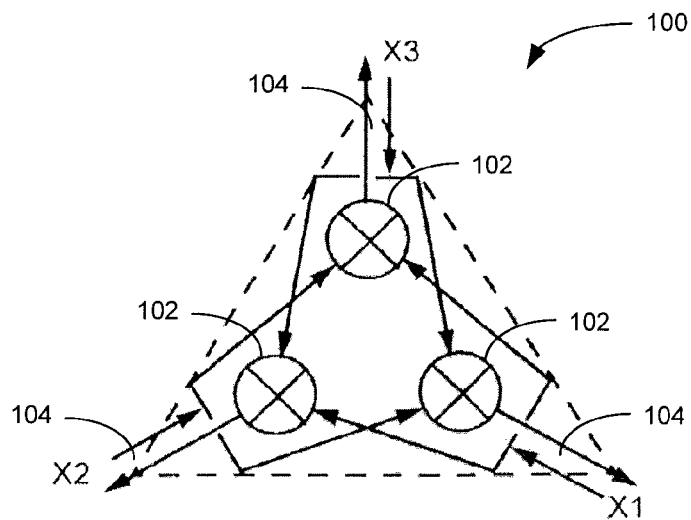
FIG. 1 *(Prior Art)*
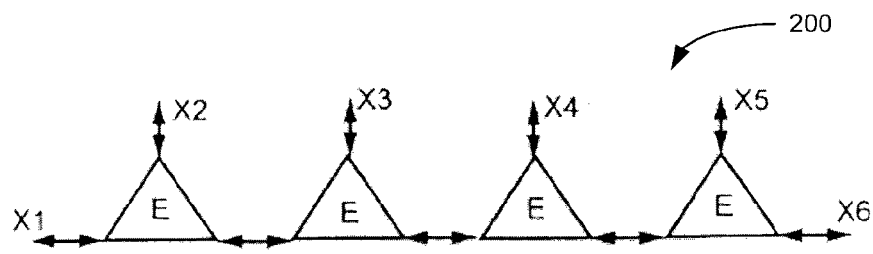
FIG. 2a *(Prior Art)*
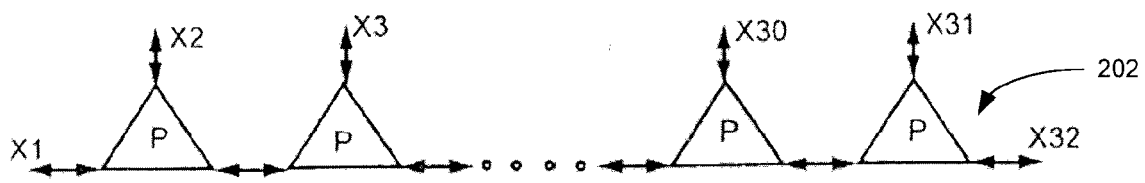
FIG. 2b *(Prior Art)*

OPTIMIZATION OF LOW DENSITY PARITY CHECK (LDPC) BUILDING BLOCKS USING MULTI-INPUT GILBERT CELLS

CROSS-REFERENCE TO RELATED APPLICATIONS

This application claims benefit under 35 USC 119(e) of Provisional Application No. 60/671,820, filed on Apr. 15, 2005.

FIELD OF THE INVENTION

The present invention relates generally to data communications, and more particularly to error correction in data communications.

BACKGROUND OF THE INVENTION

An error correcting decoder is typically implemented, e.g., in a network system, to reduce communication errors. One type of an error correcting decoder is an iterative error correcting decoder. Iterative error correcting decoders typically use a large-scale parallel network of nodes performing soft probability calculation. These nodes exchange probability information of a received data block among one another. After a certain number of iterations within an iterative decoder structure, individual noisy information in a data block (or word) is transformed into an estimate of the word as a whole. Examples of iterative decoders are the low density parity check (LDPC) decoders, Hamming decoders, Reed-Solomon decoders, Turbo decoders, and the like.

The structure of an iterative error correcting decoder can be represented graphically by a factor graph. Factor graphs are the graphical representation of the linear space of codewords (e.g., LDPC codewords). A factor graph consists of nodes and edges, where the edges are simply the wire connections between the nodes, while a node represents a function of its inputs. For example, in a low density parity check (LDPC) factor graph, there are two types of nodes representing two distinct functions—i.e., "equality constraint" nodes and "parity check" nodes. According to the IEEE 802.3ae (10GBASE-T) standard, the proposed LDPC decoder consists of (2048) equality constraint nodes and (384) parity check nodes. Each equality constraint node has (6) bidirectional connections to corresponding parity constraint nodes and each parity check node has a total of (32) bidirectional connections to corresponding equality constraint nodes. This results in a factor graph with a network matrix of (12,228) connections. The probabilities associated with received bit values iterate between these two node functions to finally resolve the most probable value of each data bit.

In an analog implementation of an LDPC decoder, the two node functions—i.e., the equality constraint function and the parity check function—are typically implemented using basic function blocks composed of Gilbert multipliers that are operated in the subthreshold region. The Gilbert multipliers in each node has corresponding output connections tied in such a way to represent the specific basic function for that node. FIG. 1 illustrates a conventional Gilbert basic function block (or cell) 100, including (3) Gilbert multipliers 102 and (3) bidirectional connections 104. Each Gilbert multiplier 102 is a 2-input Gilbert multiplier, and each bidirectional connection 104 interacts with two other bit probabilities. FIGS. 2A and 2B show block diagrams of a conventional equality constraint function 200 and a conventional parity check function 202 of an LDPC decoder, in which each function includes a plurality of Gilbert basic function blocks. Accordingly, in one implementation of a conventional analog LDPC decoder, the equality constraint function and parity check function will have at least [2048*(6−2)*3]+[384*(32−2)*3]~59,000 Gilbert multipliers. The large number of Gilbert multipliers affects the size and the power of the LDPC decoder.

An important feature of a digital LDPC decoder is the number of iterations that the iterative decoder can perform on an input codeword in a given amount of time as it relates to the bit error rate (BER) of the iterative decoder. In an analog LDPC decoder, received bit values are decoded through a diffusion process, and the amount of time for a signal (e.g., a received bit value) to go (or diffuse) through a predetermined number of equality constraint nodes and parity check nodes can be measured. For example, the parity check function 202 shown in FIG. 2 has a worst case delay of 30 cells. This large delay can be a serious bottleneck in terms of performance, which may require significantly increasing the power (per cell) to handle such a bottleneck. A proposed design to reduce the delay is to implement the Gilbert basic function blocks in a star topology as shown in FIGS. 3A and 3B. FIGS. 3A and 3B show an equality constraint function 300 and a parity check function 302 each implemented in a star topology. With respect to the equality constraint function 300, the star topology reduces the maximum delay between the farthest connection to (3) cells as indicated by path 304. Similarly, with respect to the parity check function 302, the star topology reduces the maximum delay between the farthest connection to (8) cells as indicated by path 306, which is a significant advantage over the (30) cell delay corresponding to the (linear) topology of the parity check function 202 (FIGS. 2A and 2B).

Conventionally, the equality constraint function 300 and the parity check function 302 each typically include a plurality of 2-input Gilbert multipliers, in which each 2-input Gilbert multiplier is followed by a current mirror output stage. For example, FIG. 4 illustrates a circuit diagram of a conventional (differential) 2-input Gilbert multiplier 400 that can be implemented within a parity function block. The 2-input Gilbert multiplier 400 includes an input stage 402 and an output current mirror stage 404. The output current mirror stage 404 is typically implemented at the output of a Gilbert multiplier to ensure connection compatibility among all the Gilbert cells. For example, in the circuit diagram of FIG. 4, as long as all of the output currents (e.g., Xop, Xon) are supplied by PMOS devices and all of the inputs (e.g., Xp1, Xp2, Xn1, Xn2) are NMOS current mirrors, a circuit designer can comfortably connect Gilbert cells together. However, the problem with conventional Gilbert cells with output current mirror stages is the extra propagation delay associated with current mirroring that effectively doubles the overall delay of the cell. Cell delay minimization is critical in high speed application, for example, an analog LDPC decoder requires a minimum amount of diffusion time (or the number of iterations in the digital counterpart) to deliver a target BER performance.

BRIEF SUMMARY OF THE INVENTION

In general, in one aspect, this specification describes a decoder including a first function including a first plurality of Gilbert cells, and a second function coupled to the first function. Each of the first plurality of Gilbert cells and second plurality of Gilbert cells includes n m-input Gilbert multipliers, where n is an integer greater than (3) and m=(n−1).

Implementations can include one or more of the following features. The decoder can further include an output current mirror stage coupled to each of the first plurality of Gilbert cells and each of the second plurality of Gilbert cells to ensure connection compatibility between the first function and the second function. The decoder can be an iterative decoder. The first function can comprise an equality constraint function having k bidirectional connections and the second function can comprise a parity check function having l bidirectional connections, where k and l are positive integers. The equality constraint function can be implemented using only (2) Gilbert cells, and the parity check function can be implemented using only (15) Gilbert cells. The equality constraint function and the parity check function can be each implemented in a star topology such that the equality constraint function has a maximum delay of (2) cells and the parity check function has a maximum delay of (5) cells. Each of the n m-input Gilbert multipliers can be differential Gilbert multipliers.

In general, in another aspect, this specification describes a method for implementing a decoder including implementing a first function including a first plurality of Gilbert cells and implementing a second function including a second plurality of Gilbert cells, in which each of the first plurality of Gilbert cells and second plurality of Gilbert cells includes n m-input Gilbert multipliers. The method further includes coupling the first function to the second function, where n is an integer greater than (3) and m=(n−1).

In general, in another aspect, this specification describes a method for implementing a decoder including implementing a first plurality of Gilbert cells composed only of PMOS devices, implementing a second plurality of Gilbert cells composed only of NMOS devices, and implementing a first function in the decoder including alternating one or more of the first plurality of Gilbert cells with one or more of the second plurality of Gilbert cells.

Implementations can include one or more of the following features. The method can further include implementing a second function in the decoder including alternating one or more of the first plurality of Gilbert cells with one or more of the second plurality of Gilbert cells, and coupling the first function to the second function. Each of the first plurality of Gilbert cells and each of the second plurality of Gilbert cells can include n m-input Gilbert multipliers, where n is an integer greater than (2) and m=(n−1). The equality constraint function and the parity check function can each be implemented in a star topology such that the equality constraint function has a maximum delay of (3) cells and the parity check function has a maximum delay of (9) cells.

The details of one or more implementations are set forth in the accompanying drawings and the description below. Other features and advantages will be apparent from the description and drawings.

BRIEF DESCRIPTION OF THE DRAWINGS

FIG. 1 is a block diagram of a conventional Gilbert basic function block (or Gilbert cell).

FIGS. 2A and 2B are block diagrams of a conventional equality constraint function and a conventional parity check function of an LDPC decoder.

Like reference symbols in the various drawings indicate like elements.

DETAILED DESCRIPTION OF THE INVENTION

The present invention relates generally to data communications, and more particularly to error correction in data communications. The following description is presented to enable one of ordinary skill in the art to make and use the invention and is provided in the context of a patent application and its requirements. Various modifications to implementations and the generic principles and features described herein will be readily apparent to those skilled in the art. Thus, the present invention is not intended to be limited to the implementations shown but is to be accorded the widest scope consistent with the principles and features described herein.

Figure 5:
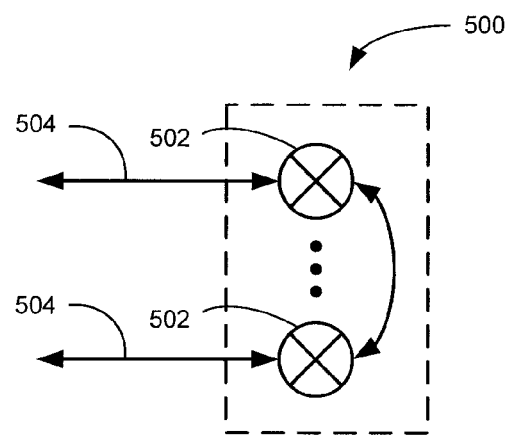
FIG. 5 is a block diagram of a Gilbert basic function block according to one implementation.

FIG. 5 shows a block diagram of a Gilbert basic function block (or Gilbert cell) 500 in accordance with one implementation of the present invention. The Gilbert basic function block 500 includes n Gilbert multipliers 502 with n corresponding bidirectional connections 504, in which each of the n Gilbert multipliers 502 is an m-input Gilbert multiplier. In one implementation, n is an integer greater than (3) and m=(n−1). Accordingly, in this implementation, the Gilbert basic function block includes (3)-input (or more) Gilbert multipliers—to significantly reduce the size of functions within a decoder (e.g., an LDPC decoder), and reduce delays of a decoder as discussed in greater detail below. In another implementation, n is an integer greater than (2). However, in this implementation, the Gilbert basic function block is composed only of PMOS devices or NMOS devices. According to this implementation, a function—e.g., an equality constraint function or a parity check function—can be implemented within a decoder by alternating Gilbert basic function blocks composed only of PMOS devices with Gilbert basic function blocks composed only of NMOS devices to substantially reduce delays associated with conventional functions of a decoder as discussed in greater detail below.

Figure 6:
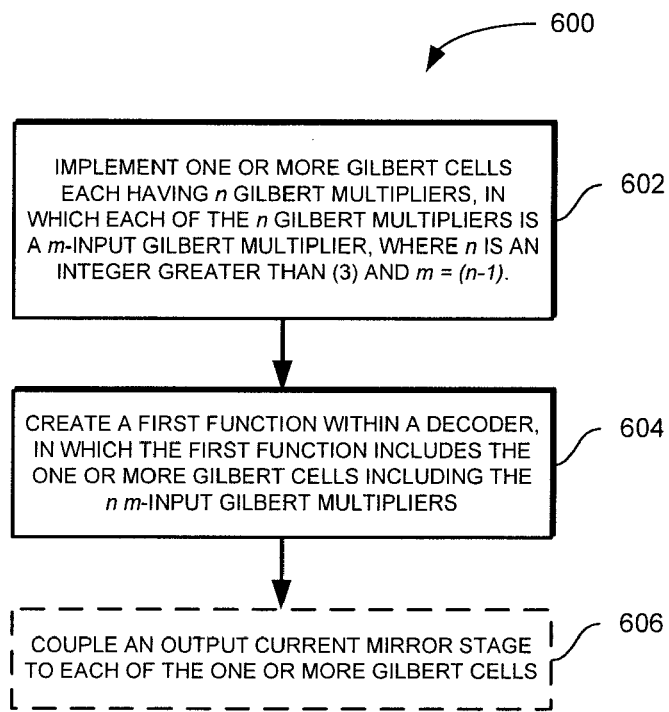
FIG. 6 illustrates a method for implementing a function within a decoder using the Gilbert basic function block of FIG. 5 in accordance with one implementation.

FIG. 6 shows a method 600 for implementing a function within a decoder (e.g., an LDPC decoder) using the Gilbert basic function block 500 in accordance with one implementation. One or more Gilbert cells each having n Gilbert multipliers are implemented (or designed), in which each of the n Gilbert multipliers is an m-input Gilbert multiplier and where n is an integer greater than (3) and m=(n−1) (step 602). A first function within the decoder is created using the one or more Gilbert cells including the n m-input Gilbert multipliers (step 604). The first function can be an equality constraint function, a parity check function, a sum-product function or the like. An output current mirror stage can be optionally coupled to each of the one or more Gilbert cells (step 606). In one implementation, the output current mirror stages to ensure connection compatibility among all the Gilbert cells.

Figure 7:
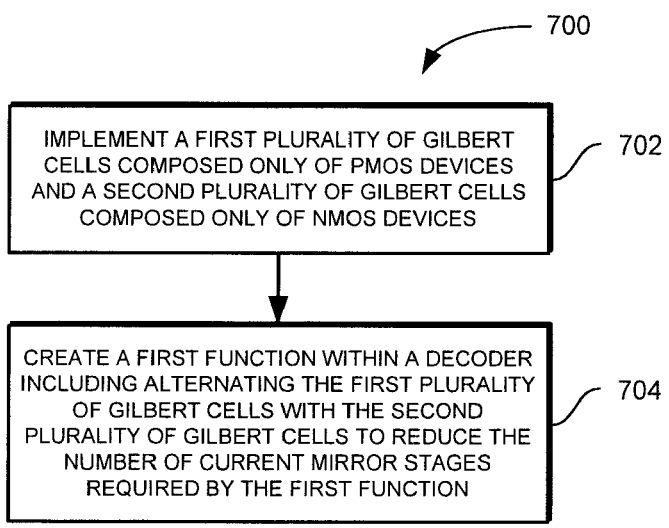
FIG. 7 illustrates a method for implementing a function within a decoder using the Gilbert basic function block of FIG. 5 in accordance with another implementation.

FIG. 7 shows a method 700 for implementing a function within a decoder (e.g., an LDPC decoder) using the Gilbert basic function block 500 in accordance with another implementation. A first plurality of Gilbert cells composed of only PMOS devices and a second plurality of Gilbert cells composed of only NMOS devices are implemented (step 702). In one implementation, each of the Gilbert cells includes n Gilbert multipliers, in which each of the n Gilbert multipliers is an m-input Gilbert multiplier where n is an integer greater than (2) and m=(n−1). A first function within the decoder is created by alternating the first plurality of Gilbert cells with the second plurality of Gilbert cells to reduce the number of current mirrors required by the function. As in the implementation discussed above with regard to method 600 (FIG. 6), the first function can be an equality constraint function, a parity check function, or the like.

Figure 8:
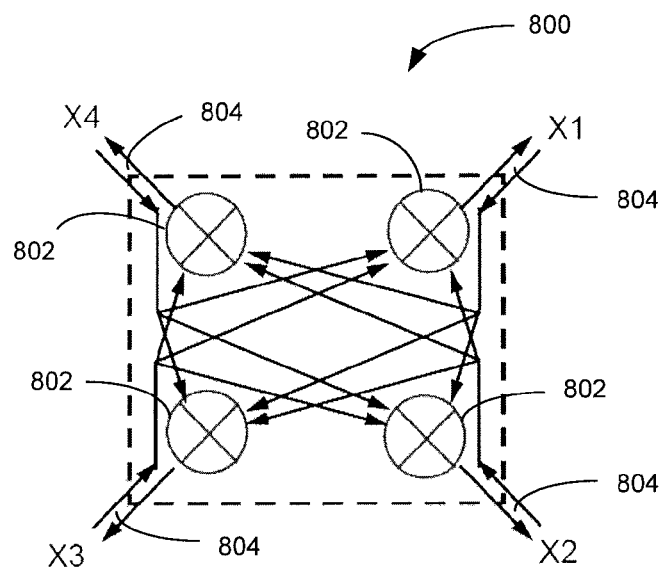
FIG. 8 illustrates a block diagram of a Gilbert basic function block including 3-input Gilbert multipliers in accordance with one implementation.
Figure 9A:
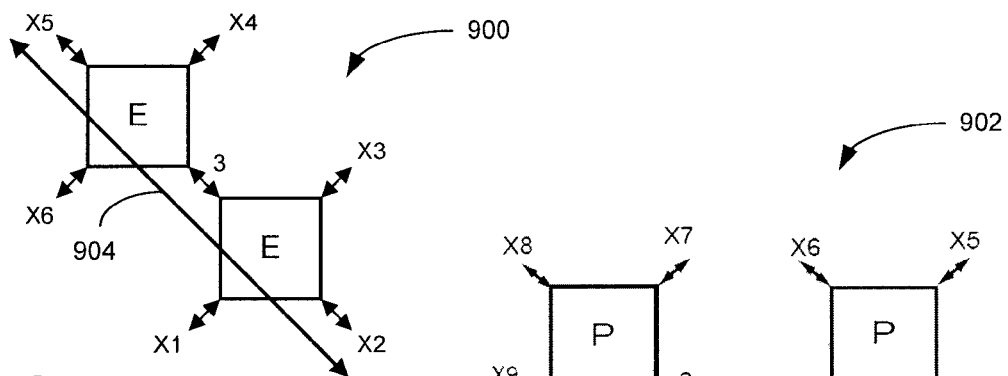
FIGS. 9A and 9B illustrate block diagrams of an equality constraint function and a parity check function in accordance with a star topology according to one implementation.
Figure 9B:
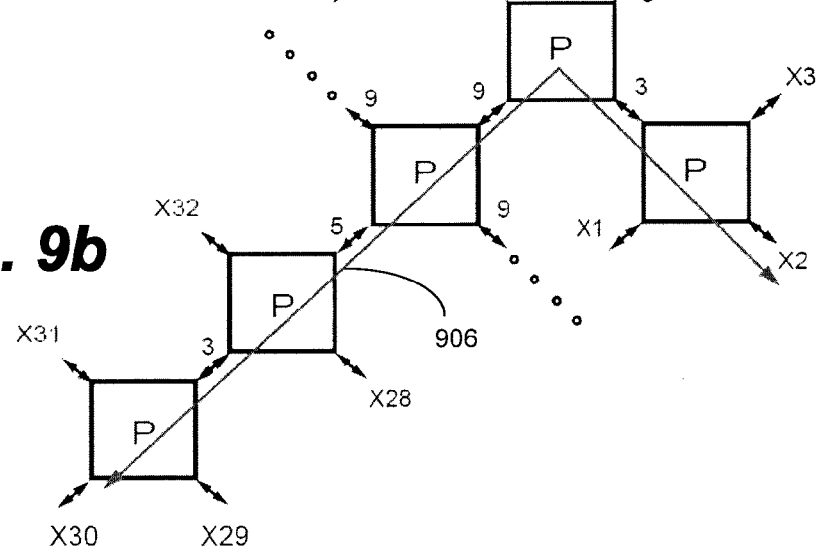

As discussed above, the optimum topology for an equality constraint function (or a parity check function) using 2-input Gilbert multipliers was that of a star topology. The conventional star topology provides for considerable time savings with respect to the worst case delay for large functions (e.g., the parity check function). Below is provided an enhanced star topology that takes advantage of 3-input Gilbert multipliers to significantly reduce the size of the functions within a decoder. FIG. 8 illustrates a block diagram of a Gilbert basic function block 800 including 3-input Gilbert multipliers in accordance with one implementation. The Gilbert basic function block 800 includes (4) 3-input Gilbert multipliers 802 and (4) corresponding bidirectional connections 804. The Gilbert basic function block 800 can be implemented in within an equality constraint function 900 or a parity check function 902 in accordance with an enhanced star topology as shown in FIGS. 9A and 9B.

Figure 3A:
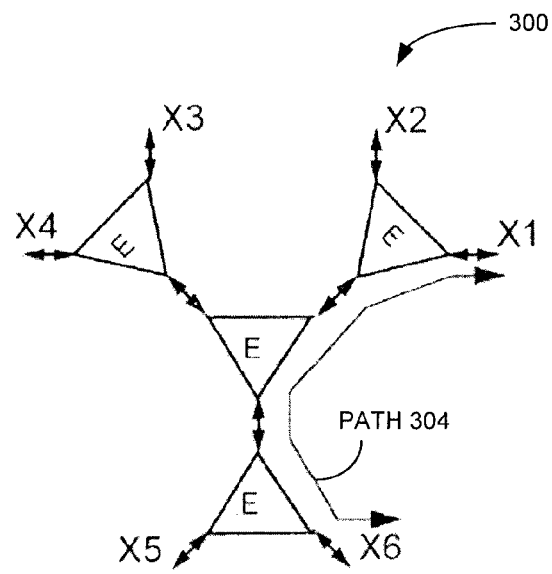
FIGS. 3A and 3B illustrate block diagrams of a conventional parity check function in accordance with a star topology.
Figure 3B:
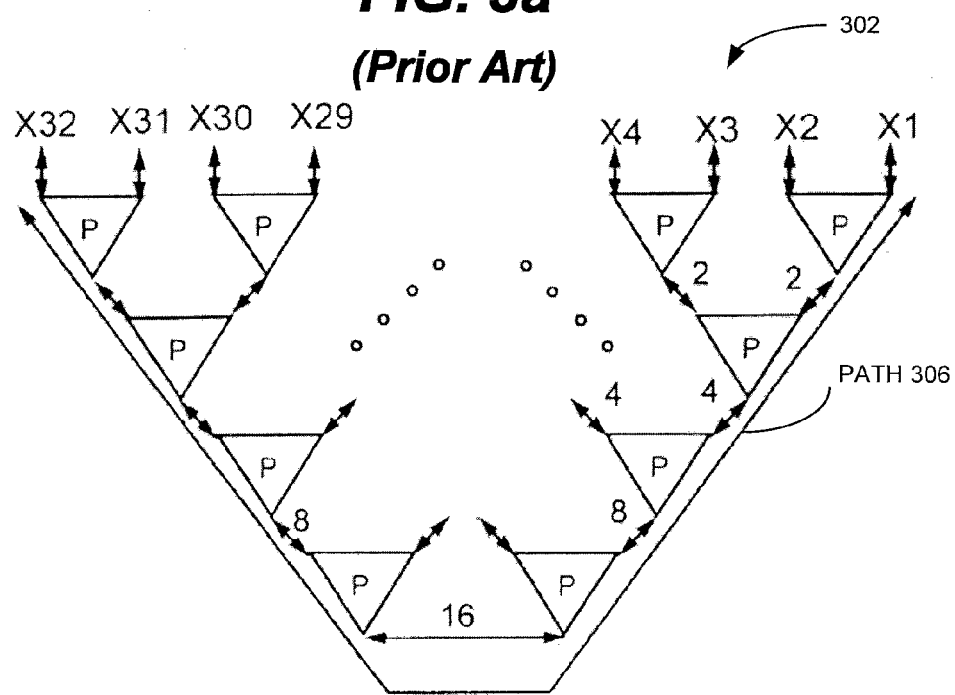
Figure 4:
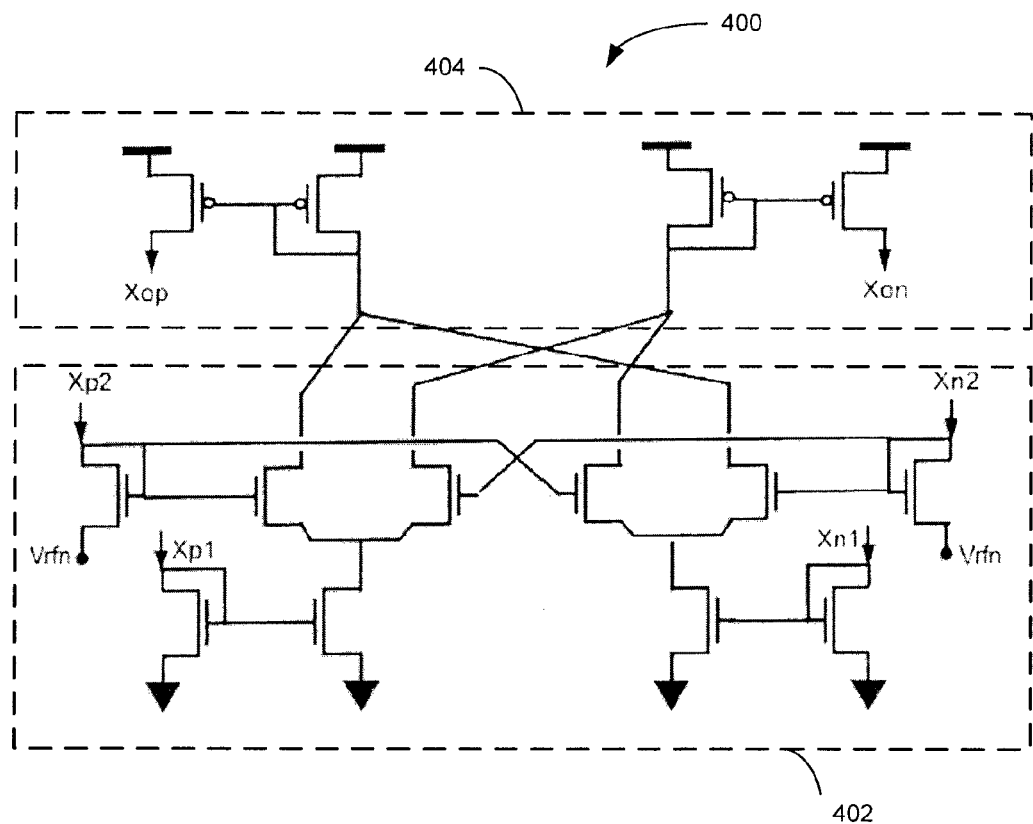
FIG. 4 illustrates a schematic diagram of a conventional 2-input Gilbert multiplier.

More specifically, the equality constraint function 900 is implemented using (2) (equality) Gilbert basic function blocks and has a maximum delay of (2) cells, as represented by path 904. The parity check function 902 is implemented using (15) (parity) Gilbert basic function blocks and has a maximum delay of (5) cell, as represented by path 906. Thus, the 3-input Gilbert multipliers reduce the number of Gilbert cells required by each of the equality constraint function and the parity check function. For example, the parity check function 902 requires only (15) Gilbert cells in contrast to (30) Gilbert cells associated with the (linear) topology of the parity check function 202 (FIG. 2B) or the star topology of the parity check function 302 (FIG. 3B). Also, the amount of delay is improved by a factor of (6) compared to the (linear) topology of the parity check function 202, and is improved by a factor of (1.6) compared to the star topology of the parity check function 302. Accordingly, the power consumed by each of the equality constraint function and the parity check function is reduced as a result of the fewer number of function blocks (or Gilbert cells) required by the respective functions.

In one implementation, the power consumed by each of the functions is further reduced by operating each Gilbert cell at a lower rate (e.g., 50% lower) compared to conventional Gilbert cells. In this implementation, a net power savings by a factor of (3×) can be attained. The power savings, however, does not directly apply to the power consumed in the connection matrix (that connects the Gilbert cells), where power consumption is primarily influenced by the interconnect capacitance. For optimization purposes of delay-power product minimization, (in one implementation) the drive strength of the Gilbert cells are scaled so that the delay of each Gilbert cell is the same. Thus, the Gilbert cells closer (and affected) by the interconnect capacitance have a higher drive strength (higher power) and Gilbert cells internal to each of the functions have a lower drive strength.

Figure 10:
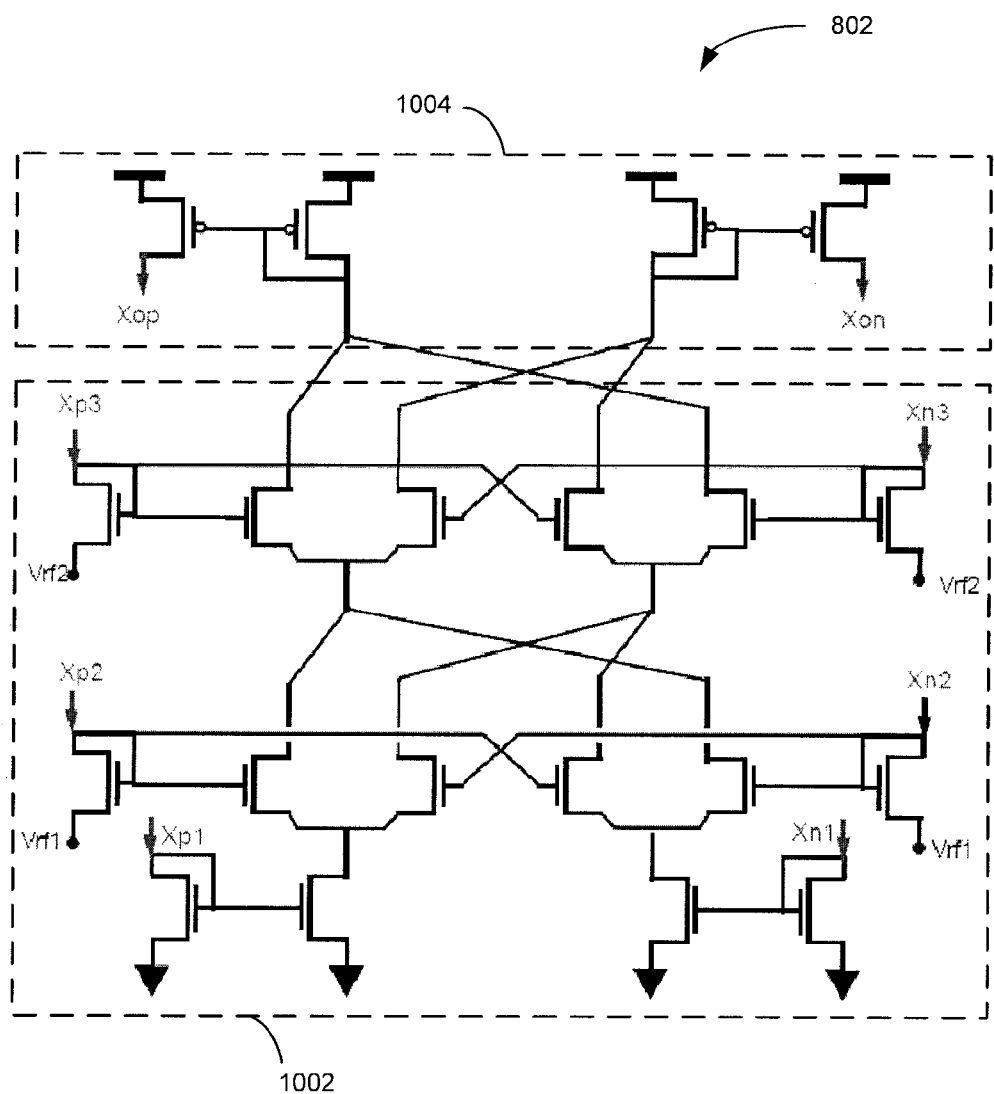
FIG. 10 is a schematic diagram of a 3-input Gilbert multiplier of FIG. 8 according to one implementation.

FIG. 10 shows a schematic diagram of a (differential) 3-input Gilbert multiplier 802 (FIG. 8) in accordance with one implementation. The implementation shown in FIG. 10 can be used within a parity check function. Note: that for the parity check function, the current does not need to be normalized as there is no current loss as in the case for the equality constraint function. In the implementation shown in FIG. 10, the 3-input Gilbert multiplier 802 includes an input stage 1002 including (3) differential inputs (Xp1, Xn1, Xp2, Xn2, Xp3, Xn3), and includes an output current mirror stage 1004 including a differential output (Xop, Xon). The input stage 1002 includes an extra stacked device as compared to a conventional 2-input Gilbert multiplier, and accordingly the design implementation of the 3-input Gilbert multiplier (in one implementation) must provide enough headroom for each transition to properly operate in the saturation region. The saturation region for sub-threshold device occurs when Vds is substantially within the range of 200-250 mV ($\gg$Ut/ 0.7). The proper headroom can be easily achieved for 3-input Gilbert multipliers that are implemented within a parity check function as the top normalizing current source can be removed. However, the implementation of 3-input Gilbert multipliers within an equality constraint function may require limiting the minimum voltage to not fall below 1.0V or 1.1V, thus requiring a 1.2V supply.

More generally, as long as a given design requirement (or application) provides ample headroom, a circuit designer (or other user) can implement Gilbert multipliers having more than (3) input ports by further stacking differential pairs within the input stage of the Gilbert multipliers. However, while Gilbert multipliers with a larger number of input ports further reduces the complexity of a given function (e.g., an equality constraint function or a parity check function), the complexity of the topology of the function (e.g., the number of function blocks (or cells)), such Gilbert multipliers typically increases complexity within a given Gilbert cell if headroom is not a problem.

As discussed above, the additional current mirrors included within the output stage of a Gilbert multiplier increases the delay associated with the Gilbert multiplier by almost a factor of (2), which can significantly adversely affect the performance of a decoder (e.g., an LDPC decoder) at high speeds. Implementations of a second enhanced star topology (also referred to as an alternating mirrored topology below) for a function (e.g., an equality constraint function or a parity check function) that reduces the number of current mirrors required by the function will now be described. In one implementation, the second enhanced star topology includes alternating mirrored Gilbert cells to reduce (or eliminate) the need for output current mirror stages. Such a topology significantly reduces the overall delay within an equality constraint function or a parity check function by a factor of (2) with respect to conventional topologies, and at the same time reduces the number of devices (e.g., PMOS or NMOS devices) to implement the functions.

Figure 11A:
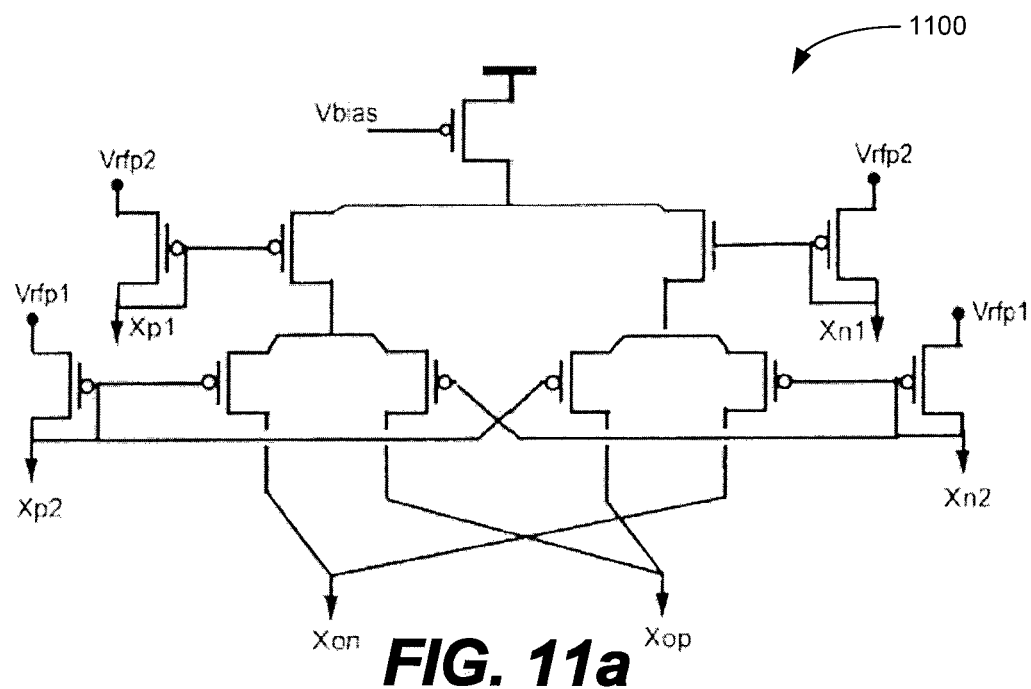
FIGS. 11A and 11B illustrate block diagrams of a PMOS Gilbert basic function block and an NMOS Gilbert basic function block according to one implementation.
Figure 11B:
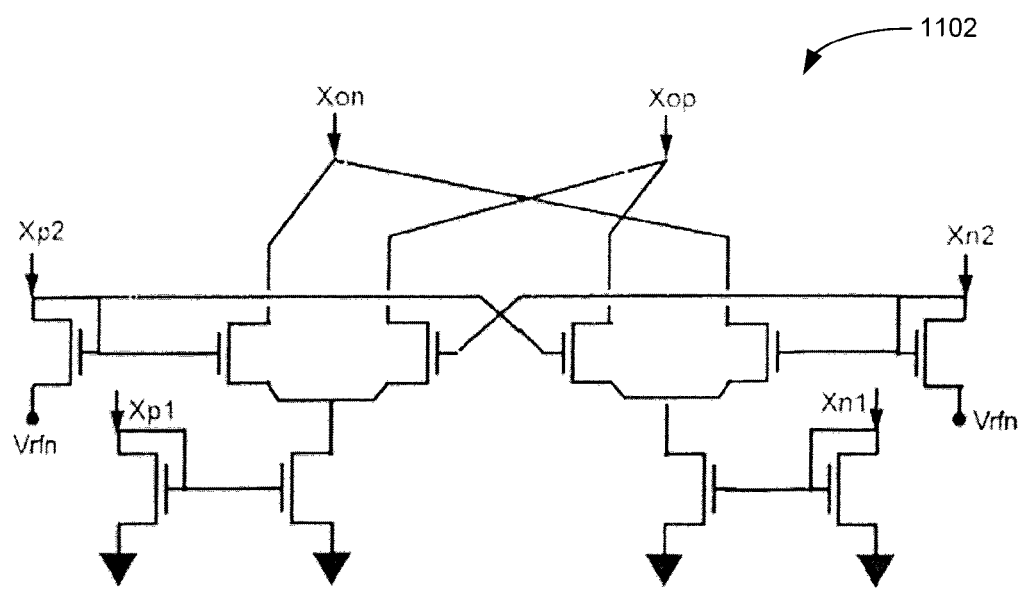

In the second enhanced topology, each Gilbert basic function block (or Gilbert cell) includes Gilbert multipliers composed of only PMOS devices or composed only of NMOS devices. For example, FIGS. 11A and 11B show a schematic diagram of a (differential) 2-input PMOS Gilbert multiplier 1100, and a (differential) 2-input NMOS Gilbert multiplier 1102 for the parity constraint function in accordance with one implementation. The 2-input PMOS Gilbert multiplier 1100 includes inputs (Xp1, Xn1, Xp2, Xn2) and outputs (Xop, Xon), and is composed only of PMOS devices. The 2-input NMOS Gilbert multiplier 1102 includes inputs (Xp1, Xn1, Xp2, Xn2) and outputs (Xop, Xon), and is composed only of NMOS devices. The 2-input PMOS Gilbert multiplier 1100 and the 2-input NMOS Gilbert multiplier 1102 can be implemented within a parity check function, and can be coupled to one another, for example, by coupling the input (Xp2, Xn2) of the 2-input PMOS Gilbert multiplier 1100 respectively to the outputs (Xop, Xon) of the 2-input NMOS Gilbert multiplier 1102. The delay through each of the 2-input PMOS Gilbert multiplier 1100 and the 2-input NMOS Gilbert multiplier 1102 is approximately half of the delay associated with a conventional 2-input Gilbert multiplier. In one implementation, the NMOS Gilbert multiplier includes a normalization current source at the bottom (not shown), which is a requirement for a 2-input Gilbert multiplier that is implemented within an equality constraint function. Such an addition of a normalization current source increases the minimum required headroom voltage.

Figure 12A:
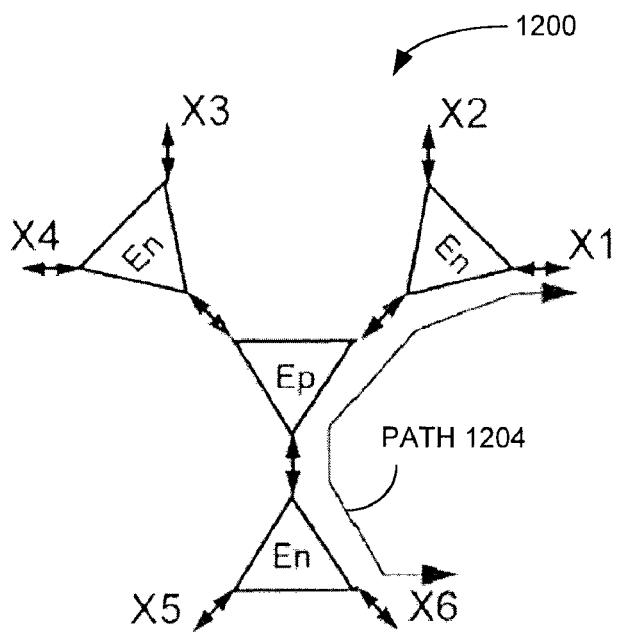
FIGS. 12A and 12B illustrate block diagrams of an equality constraint function and a parity check function in accordance with a star topology according to one implementation.
Figure 12B:
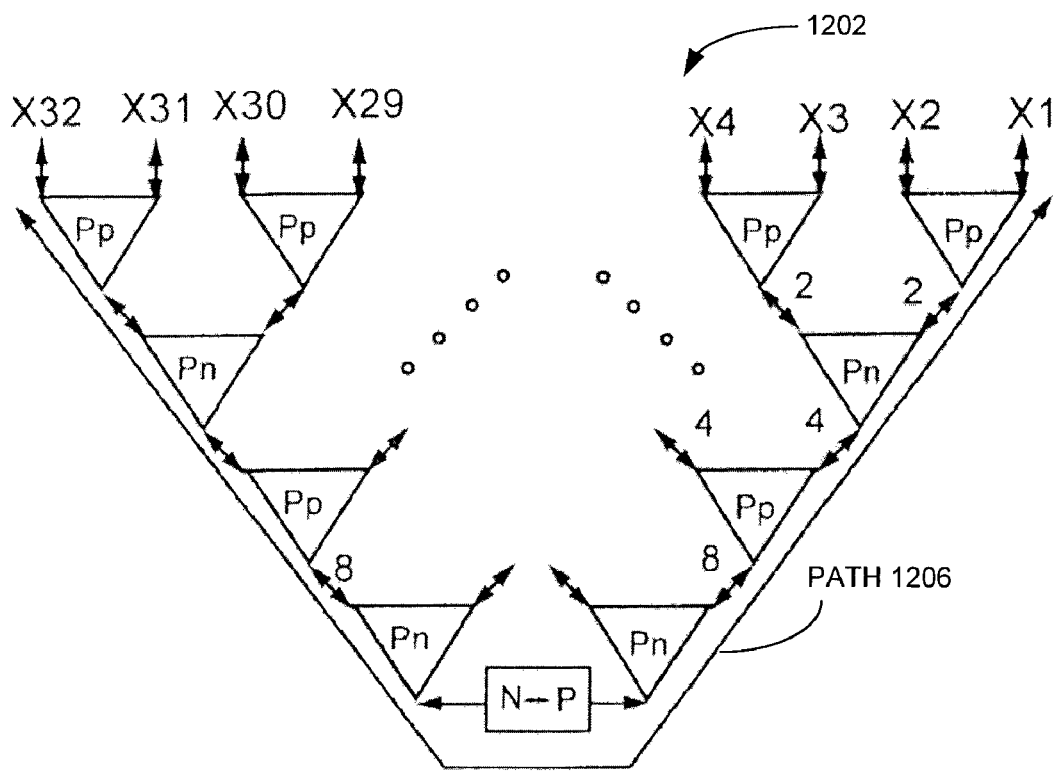

FIGS. 12A and 12B illustrates implementations of an equality constraint function 1200 and a parity check function 1202 in accordance with the second enhanced star topology. In one implementation, the boundary Gilbert cells of the equality constraint function 1200 are NMOS Gilbert cells (En) (or PMOS Gilbert cells), and the boundary Gilbert cells of the parity check function 1202 are PMOS Gilbert cells (Pp) (or NMOS Gilbert cells) so that the boundary cells of the equality constraint function 1200 can mate with the boundary cells of the parity check function 1202. The equality constraint function 1200 includes (4) Gilbert cells with a maximum delay of (3) mirror delays (represented by path 1204). The parity check function 1202 includes (30) Gilbert cells having a maximum of 8+1=9 mirror delays (or cell delays) (represented by path 1206). The reason for implementation of the additional mirror cell (N-P) at the center of the star topology is to ensure connection compatibility between the two center Gilbert cells.

The combined amount of delay for the equality constraint function and the parity check function is improved by a factor of (1.8) as compared to a conventional star topology. Moreover, the power associated with the equality constraint function and the parity check function is reduced due to halving the current of the function blocks, and the overall speed of the equality constraint function and the parity check function is improved by approximately 50% as compared to a conventional star topology. The power and speed improvement, however, does not directly apply to the power consumed in the connection matrix, which power is mainly influenced by the interconnect capacitance. As discussed above, for optimization purposes of delay-power product minimization, the drive strength of the Gilbert cells can be scaled so that the delay associated with each Gilbert cell is substantially the same. Accordingly, Gilbert cells closer to the highly capacitive interconnect can have a higher drive strength (higher power) relative to Gilbert cells that are internal to the equality constraint function and the parity check function.

Considering that (in one implementation) the alternating mirrored Gilbert multipliers have an extra stacked PMOS device compared to a conventional Gilbert multiplier, the design must be implemented to provide enough headroom for each transition to properly operate in the saturation region.

Such headroom can be provided in a 2-input parity Gilbert multiplier by removing the top normalizing current source. However, for a 2-input equality Gilbert multiplier, the minimum voltage may be required to not fall below 1.0V (or 1.1V if both the NMOS and PMOS stages have a normalization stack), thus requiring a 1.2V supply. As long as enough headroom is provided within a given application, Gilbert multipliers with more than 2-input ports can be implemented within the second enhanced star topology (or the mirrored topology).

Comparison of the Alternating Mirrored and 3-Input Gilbert Topologies

In some implementations, the alternating mirrored topology has a clear advantage of minimizing the number of current mirror stages which introduce propagation delay into a circuit. For example, the propagation delay is reduced to (3) current mirrors in the equality constraint function, and the propagation delay is reduced to (9) current mirrors in the parity check function, which totals (12) current mirror delays for the combined functions. However, there are many factors to be considered with regard to a specific implementation of a decoder (e.g., an LDPC decoder) that can affect performance of the decoder depending upon whether the decoder is implemented using the alternating mirrored topology or the 3-input Gilbert topology. Three major factors that are considered herein are power, area (or size), and mismatch requirements. To limit the scope of the problem, the analysis is limited to a 10GE LDPC decoder and the equality constraint function which is a smaller block than the parity check function, and is used much more frequently.

With respect to power, it is assumed that size scaling is performed so that the output cells (e.g., the boundary Gilbert cells) driving the interconnect have a maximum drive and the internal (Gilbert) cells have a reduced drive. In one implementation, scaling according to a factor of (3) is considered so that the drive of each output cells is 9 uA, each middle cell is 3 uA, and each internal cell is 1 uA. With such assumptions the power for the equality constraint function is as follows:

Alternating mirrored topology: 1 uA*2*3+3 uA*2*3+9 uA*6=78 uA 3-input Gilbert topology: (1 uA+3 uA)*2+ (3 uA+9 uA)*6=80 uA Thus the alternating mirror topology has a 2.5% power improvement over the 3-input Gilbert topology. For the same power consumption, and assuming delay improves linearly with power, the alternating mirrored topology is approximately 18.5% (+16%+2.5%) faster relative to the 3-input topology.

Mismatch clearly defines the devices sizes and, therefore, the area of a device. In this example, a consideration is made of how many current mirrors stages that (5) of the (6) inputs associated with the equality constraint function should go through to generate the 6th output. Both the alternating mirrored topology and the 3-input Gilbert topology have a total of (8) current mirror stages. Thus, the device sizes associated with the current mirror stages can be used for scaling purposes.

As for area, one of the main drawbacks of the alternating mirrored topology is that the output stage driving the line with maximum drive of 9 uA, is not just a simple output current mirror buffer, but is in fact a 2-input Gilbert multiplier. That means all of the devices must be as large as the output device of the 3-input Gilbert multiplier to be able to drive the same current, and also to have the same matching parameters. In the cells, we have the main Gilbert multiplier cell and also the diode connected devices to convert currents to voltages for the Gilbert cells. The basic internal Gilbert cell (1 uA current drive) is assumed to have a width-to-length ratio (W/L)=10 um/0.5 um. Thus one basic Gilbert cell has a total width of 60 um (=2*10 um+4*10 um). Thus we have: Alternating mirrored topology:

Gilbert cells=60 um*2*3+60 um*4*3+60 um*9*6

Diode devices=20 um*2*3+20 um*4*3+20 um*9*6

Total device width per equality node=5760 um 3-input Gilbert topology:

Gilbert cells=180 um*2+420 um*6

Diode devices=180 um*2+420 um*6

Total device width per Equality node=4080 um

Area Ratio=Alternating mirrored area/3-input Gilbert=5760/4080=1.41

Therefore, (in one implementation) the area overhead of the alternating mirrored topology is higher than that of the 3-input Gilbert topology. The effect of this area increase in an actual implementation is that all dimensions will be larger in the alternating mirrored topology by a square root of the area ratio, which is approximately 19%. This area increase translates into longer wire length in the networks and thus proportionally higher wire capacitances that affects the overall cell delay.

Thus to still maintain the same delay per cell as that in the 3-input Gilbert topology, in one implementation, the power of all cells is increased (so that the same factor of (3) scaling stills holds) by approximately 19% in the alternating mirrored topology. Otherwise, the original calculations that showed the alternating mirrored topology to be faster due to fewer current mirror delays does not hold. However, in this case, to have a fair comparison of delay between the two topologies, in one implementation the comparisons are performed using the same power consumption levels for two topologies. Therefore, if we increase the power in the 3-input Gilbert cell by approximately 19%, and assume that delay decreases proportionally with power, one can expect the 3-input cell to also have substantially a 19% improvement in speed when decoders respectively implemented with the two topologies are consuming the same power. Considering that the original calculation of the alternating mirrored topology had 18.5% speed superiority compared to the 3-input Gilbert topology, the extra 19% improvement in the 3-input topology brings the two topology to the same level of performance if the performance is defined in terms of power and speed product.

However, increasing the power in the alternating mirrored topology is not the best approach to achieving the same performance at the same power as that of the 3-input Gilbert topology due to the area disadvantage of the alternating mirrored topology. Another way to address this problem is to address the cause for the alternating mirrored topology to have such an area disadvantage. The area disadvantage is mainly caused by having the whole Gilbert multiplier directly drive the long connections instead of a simple current mirror. By implementing a current mirror to each output Gilbert multiplier, the effective round trip delay associated with the alternating mirrored topology becomes (14) current mirrors, which is equivalent to the number of current mirrors in the 3-input Gilbert topology. However, unlike with the 3-input Gilbert topology, the alternating mirrored topology can have a significant saving in terms of area without a large hit in power, and with substantially the same speed performance, as shown below. Area and power of the alternating mirrored topology using current mirror buffers:

Gilbert cell sizes=6 um*2*3+60 um*2*3+ 60 um*3*6+10 um*9*6

Diode device sizes=20 um*2*3+20 um*2*3+ 20 um*3*6+10 um*9*6

Total device width per equality node=3480 um

Total power per equality node=1 uA*2*3+ 1 uA*2*3+3 uA*6+9 uA*6=84 uA

As shown in the above calculations, the alternating mirrored topology is superior with current mirror buffers as the area is reduced significantly to be approximately 15% less than the area associated with the 3-input Gilbert topology, with only a 5% increase in power and the same number of current mirror delays. A 15% reduction in area corresponds approximately to a 7.5% reduction in wire length, and therefore almost the same amount of reduction in power. Therefore, the two topologies deliver substantially the same performance in terms of a speed/power ratio, but the alternating mirrored topology including current mirror buffers has considerably less area.

Figure 13:
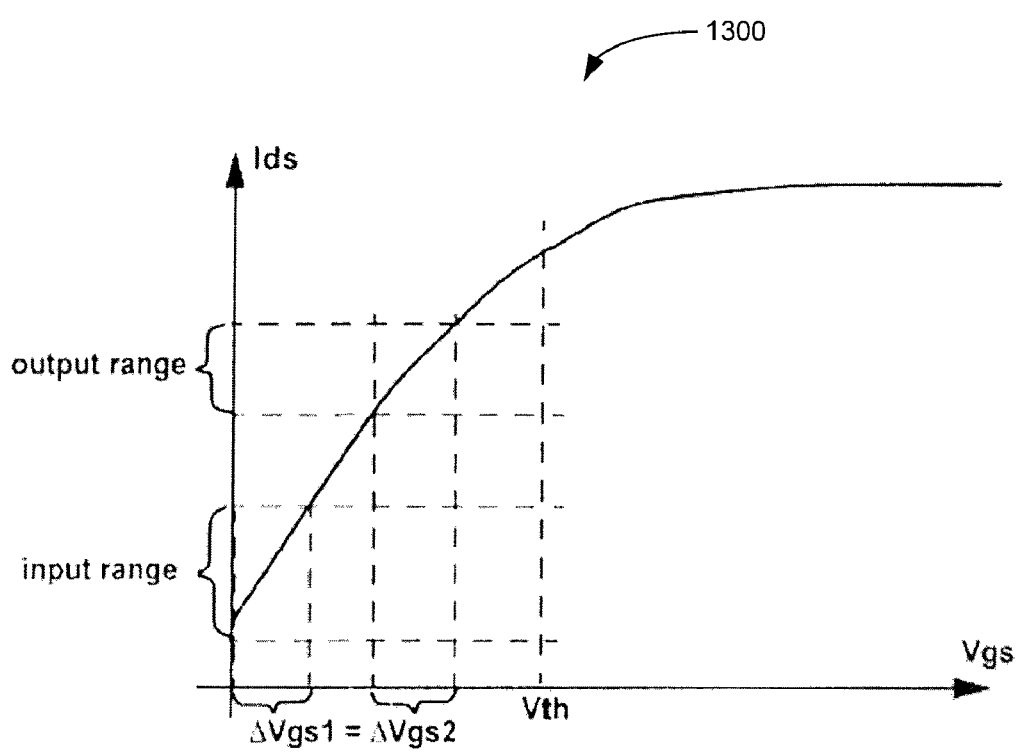
FIG. 13 shows a graph of voltages against the translinear equation.

Although the above analysis shows the two topologies are equal in terms of performance, certain considerations and tradeoffs can be considered that many make one of the topologies more attractive for a given application. For example, in one implementation, one advantage of the alternating mirrored topology is that in the equality 3-input Gilbert multiplier where there are (3) stacks of devices, the upper stages will have smaller currents than that of a 2-input Gilbert multiplier within the alternating mirrored topology which gets normalized after each stack of two. Such a difference in the total sum input and output currents of the normalizing stage is a problem when the subthresholded region does not have an ideal exponential transfer. Basically, in faster technologies and applications with smaller threshold voltages (Vth) and larger leakage currents, the nice exponential region shrinks further, and the range of currents that satisfy the translinear equation shrinks as well as shown in FIG. 13. Since the two currents into the diode devices are very small, the currents fall within the very low region of the exponential transfer curve, however, the currents are subject to clipping as the input currents can be smaller than the off current of the device. This results in a smaller gate-to-source (Vgs) difference between the two devices. Based on the translinear equation, the voltage difference generated from the input diode devices will determine the current in the output devices. If the output diode devices are biased at higher current values, and the current values fall close to the non-exponential region due to a reduction in threshold voltage, the Vgs to Ids gain is reduced for the output devices. Thus, not only may the difference voltage from the output diode devices be small due to clipping, the output current can be further attenuated by falling into the non-exponential region, thus creating a large gain error in these stages. Therefore, the goal is to maintain the sum current of the differential branches with minimum attenuation, which is achieved within the alternating mirrored topology, and not so much with the 3-input Gilbert topology.

In one implementation, another advantage of the alternating mirrored topology is the Gilbert multipliers of the (2-input) alternating mirrored topology have one less stack compared to Gilbert multipliers in the 3-input Gilbert topology, and therefore larger currents can be provided into the output current mirror stages resulting in a larger Gm of the diode connected devices and a faster response. Another trade off is that a circuit designer can reduce the size of the output devices in the alternating mirrored topology (which output devices take up a majority of the area of a decoder) without much hit in the overall mismatch, as the mismatch is more determined by the smaller devices than the larger devices. Thus, the overall decoder area and wiring capacitance can be reduced. Thus, careful design of a decoder in accordance with the alternating mirrored topology (in some implementations) can result in a better performance than a decoder in accordance with the 3-input Gilbert topology.

Various implementations of a decoder and decoder functions have been described. Nevertheless, one of ordinary skill in the art will readily recognize that there that various modifications may be made to the implementations, and those variations would be within the scope of the present invention. For example, though examples described above generally described in the context of 10G LDPC decoder implementation, the use of 3-input (or more) Gilbert multipliers can be expanded to all analog applications that include Gilbert multipliers that operate in the sub-threshold region to further improve speed, power, and area requirement of the overall circuit. Accordingly, many modifications may be made without departing from the scope of the present invention.

What is claimed is:

1. An iterative decoder comprising:
a first function including a first plurality of Gilbert cells, each of the first plurality of Gilbert cells including n m-input Gilbert multipliers, wherein the first function comprises an equality constraint function having k bidirectional connections; and
a second function coupled to the first function, the second function including a second plurality of Gilbert cells, each of the second plurality of Gilbert cells including n m-input Gilbert multipliers, wherein the second function comprises a parity check function having l bidirectional connections, where k and l are positive integers, and
wherein n is an integer greater than (3) and m=(n−1).

2. The iterative decoder of claim 1, further comprising an output current mirror stage coupled to each of the first plurality of Gilbert cells and each of the second plurality of Gilbert cells to ensure connection compatibility between the first function and the second function.

3. The iterative decoder of claim 1, wherein the equality constraint function is implemented using only (2) Gilbert cells and the parity check function is implemented using only (15) Gilbert cells.

4. The iterative decoder of claim 3, wherein the equality constraint function and the parity check function are each implemented in a star topology such that the equality constraint function has a maximum delay of (2) cells and the parity check function has a maximum delay of (5) cells.

5. The iterative decoder of claim 1, wherein each of the n m-input Gilbert multipliers are differential Gilbert multipliers.

6. A method for implementing an iterative decoder comprising:
implementing a first function including a first plurality of Gilbert cells, each of the first plurality of Gilbert cells including n m-input Gilbert multipliers, wherein implementing a first function includes implementing an equality constraint function having k bidirectional connections, where k is a positive integer; and
implementing a second function including a second plurality of Gilbert cells, each of the second plurality of Gilbert cells including n m-input Gilbert multipliers, wherein implementing a second function includes implementing a parity check function having l bidirectional connections where l is a positive integer; and
coupling the first function to the second function,
wherein n is an integer greater than (3) and m=(n−1).

7. The method of claim 6, further comprising coupling an output current mirror stage to each of the first plurality of Gilbert cells and each of the second plurality of Gilbert cells to ensure connection compatibility between the first function and the second function.

8. The method of claim 6, wherein the equality constraint function is implemented using only (2) Gilbert cells and the parity check function is implemented using only (15) Gilbert cells.

9. The method of claim 8, wherein the equality constraint function and the parity check function are each implemented in a star topology such that the equality constraint function has a maximum delay of (2) cells and the parity check function has a maximum delay of (5) cells.

10. The method of claim 6, wherein each of the n m-input Gilbert multipliers are differential Gilbert multipliers.

11. A method for implementing an iterative decoder comprising:
implementing a first plurality of Gilbert cells composed only of PMOS devices;
implementing a second plurality of Gilbert cells composed only of NMOS devices, wherein each of the first plurality of Gilbert cells and each of the second plurality of Gilbert cells includes n m-input Gilbert multipliers, wherein n is an integer greater than (2) and m=(n−1);
implementing a first function in the iterative decoder including alternating one or more of the first plurality of Gilbert cells with one or more of the second plurality of Gilbert cells, wherein implementing a first function includes implementing an equality constraint function having k bidirectional connections, where k is a positive integer;
implementing a second function in the iterative decoder including alternating one or more of the first plurality of Gilbert cells with one or more of the second plurality of Gilbert cells, wherein implementing a second function includes implementing a parity check function having l bidirectional connections, where l is a positive integer; and
coupling the first function to the second function.

12. The method of claim 11, wherein the equality constraint function and the parity check function are each implemented in a star topology such that the equality constraint function has a maximum delay of (3) cells and the parity check function has a maximum delay of (9) cells.

* * * * *